US008953722B2

(12) United States Patent
Rueckriem et al.

(10) Patent No.: US 8,953,722 B2
(45) **Date of Patent: *Feb. 10, 2015**

(54) CONTROLLED TRANSMISSION OF DATA IN A DATA TRANSMISSION SYSTEM

(75) Inventors: Reinhard Rueckriem, Munich (DE); Michael Flath, Taufkitchen (DE)

(73) Assignee: Infineon Technologies AG, Neubiberg (DE)

( * ) Notice: Subject to any disclaimer, the term of this patent is extended or adjusted under 35 U.S.C. 154(b) by 43 days.

This patent is subject to a terminal disclaimer.

(21) Appl. No.: 13/344,740

(22) Filed: Jan. 6, 2012

(65) Prior Publication Data

US 2012/0106682 A1 May 3, 2012

Related U.S. Application Data

(63) Continuation of application No. 11/945,719, filed on Nov. 27, 2007, now Pat. No. 8,098,778.

(51) Int. Cl.
*H03D 1/04* (2006.01)
*H04H 40/27* (2008.01)

(52) U.S. Cl.
CPC .................................... *H04H 40/27* (2013.01)
USPC .......................................... 375/346; 375/260

(58) Field of Classification Search
USPC .................................................. 375/346, 260
See application file for complete search history.

(56) References Cited

U.S. PATENT DOCUMENTS

| | | | | |
|---|---|---|---|---|
| 6,434,205 | B1 | 8/2002 | Taura et al. | |
| 2005/0073944 | A1 | 4/2005 | Rudkin | |
| 2009/0227210 | A1 * | 9/2009 | Mak et al. | 455/67.16 |

FOREIGN PATENT DOCUMENTS

| | | | |
|---|---|---|---|
| DE | 69232431 | T2 | 5/2005 |
| EP | 1199804 | A2 | 4/2002 |

OTHER PUBLICATIONS

Prosecution History related to U.S. Appl. No. 12/272,152, filed Nov. 17, 2008, including the following documents and any and all patents and content thereof: May 6, 2011, Non-Final Rejection, Sep. 7, 2011 Applicant summary of interview with examiner, and Sep. 14, 2011 Examiner Interview Summary Record (PTOL-413).

* cited by examiner

*Primary Examiner* — Kevin Kim
(74) *Attorney, Agent, or Firm* — SprylP, LLC

(57) ABSTRACT

This disclosure relates to controlled transmission of data in a data transmission system. Data from data interface elements may be transmitted in a controlled manner during the guard intervals or cyclic expansions of received RF signals. The received RF signals may be initially analyzed by a receiver to gather its characteristics. Based on the characteristics, the data interface elements are instructed to transfer the data during the guard intervals of the incoming RF signals.

18 Claims, 5 Drawing Sheets

CONTROLLED TRANSMISSION OF DATA IN A DATA TRANSMISSION SYSTEM

RELATED APPLICATIONS

This application is a Continuation of co-pending application Ser. No. 11/945,719, which was filed on Nov. 27, 2007. The entire contents of the co-pending application are incorporated herein by reference.

BACKGROUND

Devices that integrate capabilities to directly convert radio frequency (RF) signals to baseband signals onto one chip can introduce disturbing crosstalk of data streams. For example, in a DVB-T (Digital Video Broadcast-Terrestial) system associated with broadcast transmission of digital terrestrial television, RF signals received by device (receiver) are exposed to various disturbances, noises, etc. At least a part of such noises and disturbances are usually generated by various internal and external elements in the DVB-T system. Such noises and disturbances can increase the probability of errors in extracting information from the RF signals by the receiver.

In such systems, measures have been taken to suppress noise and disturbance, or shield disturbances from interfering with the received radio frequency signals; however, such measures are usually not effective. Therefore, there remains a need to improve the way interference is avoided between noise and disturbance, and the received RF signals.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Figure 1:
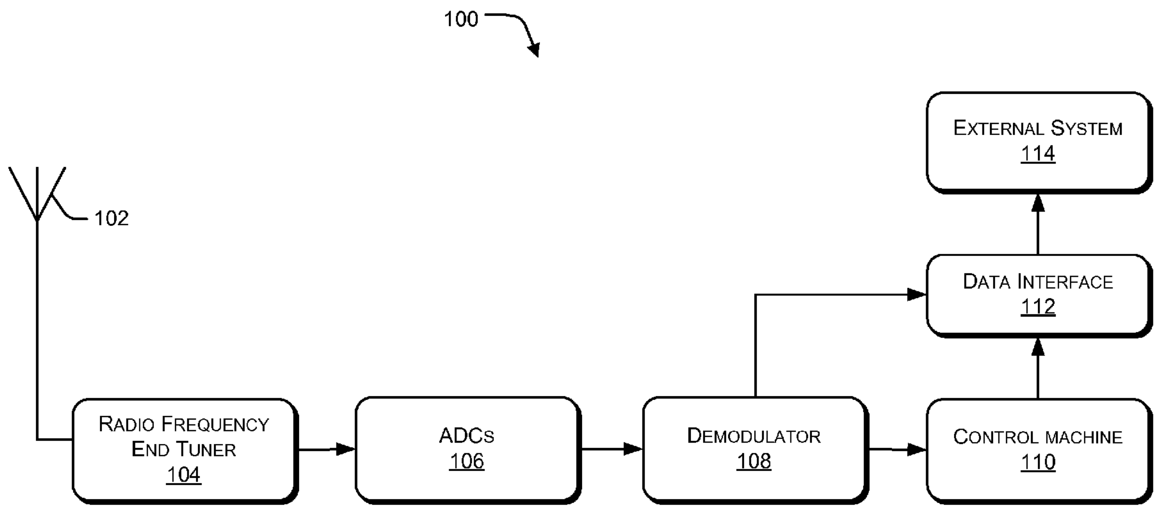
FIG. 1 is a block diagram illustrating an implementation of a RF signal receiver that enables controlled transmission of data in a data transmission system.

Disclosed herein are techniques for controlled transmission of data in a data transmission system. In an implementation, a device receives a radio frequency (RF) signal through one or more antennae. For example, the RF signal is an Orthogonal Frequency Division Multiplexing (OFDM) signal that includes data signals as symbols separated by guard intervals. A radio frequency end tuner receives the RF signal from the antennae, and a control machine analyzes the signal and enables controlled transmission of data from a data interface during the guard intervals of the RF signal.

The techniques described herein may be implemented in a number of ways. One example environment and context is provided below with reference to the included figures and on going discussion.

Overview

Generally in a digital data transmission system, an RF signal, which includes OFDM signals, is received by a receiver through one or more antennas. The RF signal includes relevant information to be transmitted in the form of symbols. OFDM signals also include guard intervals which are cyclic expansions. In an OFDM signal, the symbols are separated by guard intervals, so that interference of symbols is avoided. Furthermore, guard intervals allow avoidance of interference of signals such as echoes, noises, and any other disturbances with the symbols, provided the signals fall within the guard intervals. Typically, the guard intervals are discarded by the receiver during demodulation of the RF signal.

The received RF signal is converted into a baseband signal by a radio frequency tuner. The signal from the radio frequency end tuner may be a baseband intermediate frequency signal (IF), including a low intermediate frequency or zero intermediate frequency signal. The baseband signal is then converted to a digital signal by an analog to digital convertor (ADC). The digital signal may be demodulated by a demodulator such as an OFDM demodulator to decode the original transmitted baseband signal (i.e., demodulated signal). In an implementation, the baseband signal may be sent to the demodulator when the baseband signal is obtained from a digital RF signal.

The demodulator then transmits the demodulated signal through various data interface elements (e.g., busses, circuits, etc.), for presentation to a user. Such data interface elements may generate signals. In other words, internal elements such as interfaces can generate data or disturbances which may interfere with the received RF signal, and corrupt the information conveyed in the RF signal.

The techniques described herein address effective elimination of interference by signals generated by internal elements (e.g., data interface elements) with incoming RF signals. According to one implementation, a controlled transmission of signals or data from internal elements is provided, during guard intervals of the RF signals. In this case, the RF signals are analyzed by the receiver to gather its characteristics. The characteristics may include for example, length of the guard intervals and length of the symbols. Based on the characteristics, the data interface elements are instructed to transfer the internal element data during the guard intervals of the incoming RF signals. Thus, the interference of internal element data or signals with the RF symbols can be avoided.

The techniques described herein may be used in different operating environments and systems. Multiple and varied implementations are described below. An exemplary environment that is suitable for practicing various implementations is discussed in the following section.

Exemplary System

FIG. 1 illustrates a exemplary RF signal receiver 100 for implementing controlled transmission of data during guard intervals of a RF signal. The receiver 100 may be part of a digital data transmission system for example, digital audio broadcasting (DAB) and digital video broadcasting (DVB), including terrestrial (DVB-T) and handheld (DVB-H). The receiver 100 receives and processes RF signals carrying relevant information. The RF signals can be in the form of OFDM signals, and include information in the form of symbols and guard intervals separating the symbols. It is to be noted that the insertion of guard intervals between the symbols may be performed by a transmitter that transmits the RF signals.

The receiver 100 receives the RF signal through one or more antennae 102. The receiver 100 includes a radio frequency end tuner 104, at least one Analog to Digital Convertor(s) (ADCs) 106, a demodulator 108, a control machine 110, a data interface 112, and an external system 114 (e.g., host or multimedia processor, which is able to store demodulated data). The radio frequency end tuner 104 converts the received RF signal to a baseband signal. The signal from the radio frequency end tuner 104 may be a baseband intermediate frequency (IF) signal, including a low IF or zero IF signal.

In an implementation, the baseband signal may be obtained from an analog RF signal. In such cases, the ADCs 106 convert the baseband signal into a digital baseband signal and sends the digital baseband signal to the demodulator 108. In another implementation, the baseband signal may be obtained from a digital RF signal. In such a scenario, the baseband signal is a digital signal that may be directly sent to the control machine 110 by the radio frequency end tuner 104.

The demodulator 108 analyzes the digital baseband signal to identify its characteristics. The characteristics may include, for example, the starting point of the guard intervals and symbols, and time length of the guard intervals and symbols. It is to be noted that the digital baseband signal retains similar characteristics as that of the RF signal. In other words, the length of the guard intervals or symbols does not change when the incoming RF signal is converted into a digital baseband signal.

The demodulator 108 demodulates the digital baseband signal to generate a demodulated signal that includes the relevant data. In an implementation, the demodulator 110 may be an OFDM demodulator that demodulates a digital baseband signal obtained from a received OFDM signal, to gather audio or video data transmitted by the received OFDM signal. In another implementation, the demodulator 110 separates the guard interval and symbols in the digital baseband signal during the demodulation process.

The control machine 110 sends the demodulated signal through the data interface 112 to an external system 114 for presentation to the user. The data interface 112 may include other internal elements of the receiver 100, such as data busses, printed circuit boards, and integrated circuits (ICs).

To eliminate interferences that may be introduced by the data interface 112, control machine 110 may control the transfer of demodulated signal such that the signal is transmitted to the external system 114 during the guard interval. The control machine 108 determines a guard interval of the incoming RF signal and a permissible time duration within which the demodulated signal can be transferred. Thereafter, the control machine 110 instructs the data interface 112 to transfer the demodulated signal during the permissible time duration. In such a case, signals transferred by the data interface 112 fall within the guard interval of the incoming RF signal. The signals can include the demodulated signal and noises or disturbances generated by the data interface 112.

Once the guard interval elapses, the control machine 110 triggers the data interface 112 to hold the transmission of the demodulated signal thereby stopping the generation of the signals until the next guard interval arrives. Thus, the signals fall within the guard interval and the interference of the signals with the actual data or symbols of the incoming RF signal may be avoided. The above described controlled transmission of data by the data interface 112 may also be repeated during the subsequent guard intervals of the incoming RF signal.

Therefore, the RF signal received by the radio frequency end tuner 104 avoids interference with noises or disturbances with the symbols or data from the data interface 112. Any such noises or disturbances from the data interface 112 is present only during the guard intervals.

Figure 2:
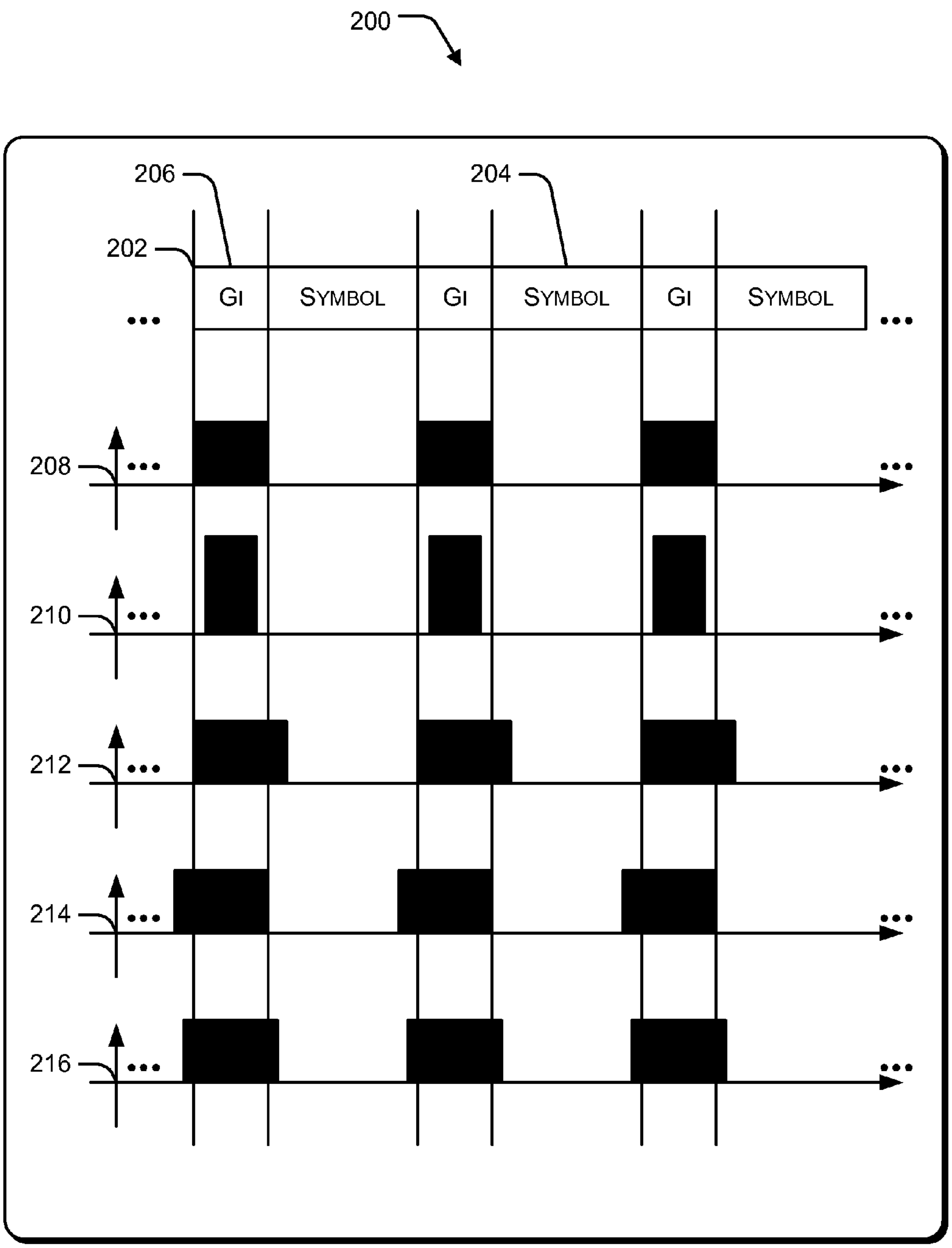
FIG. 2 is a graph illustrating radio frequency signals without controlled transfers of data in a data transmission system.

FIG. 2 illustrates radio frequency signals of controlled transfers of data in a data transmission system. The graph 200 shows the RF signals carrying signals in various scenarios. Particular scenarios include transfer time less than or equal to guard interval length, and transfer time greater than guard interval length.

The RF signal 202 includes symbols 204 and guard intervals 206. As described above, the symbols 204 include the actual or relevant data to be transferred and each of the symbols 204 may be preceded by the guard interval 206. In a scenario 208, the data transfer rate of the data or demodulated signal may be equal to a time length of the guard interval 206. In such a scenario, the signals transferred by the data interface 112 fall within the guard intervals 206. In this scenario, an interference of the signals with the symbols 204 is absent.

The interference is also absent in a scenario 210 where the required data transfer rate of the demodulated signal is less than the time length of the guard interval 206. However, in some instances, as in the case of scenarios 212, 214, and 216, the data transfer rate of the demodulated signal may cross the time length of the guard interval 206.

In a scenario 212, the signals interfere with the symbol 204 transmitted before the guard interval 206. In another scenario 214, the signals interfere with the symbol 204 transmitted after the guard interval 206. In yet another scenario 216, the noises or disturbances interfere with the symbols 204 transmitted before and after the guard interval 206. This may be due to a greater time period for transfer of the data or demodulated signal as compared to the time length of the guard interval 206. It is noted that interference of the signals with the symbols can generate errors in the demodulated signal and results in graceful degradation in the sensitivity of the receiver 100.

Exemplary Device

Figure 3:
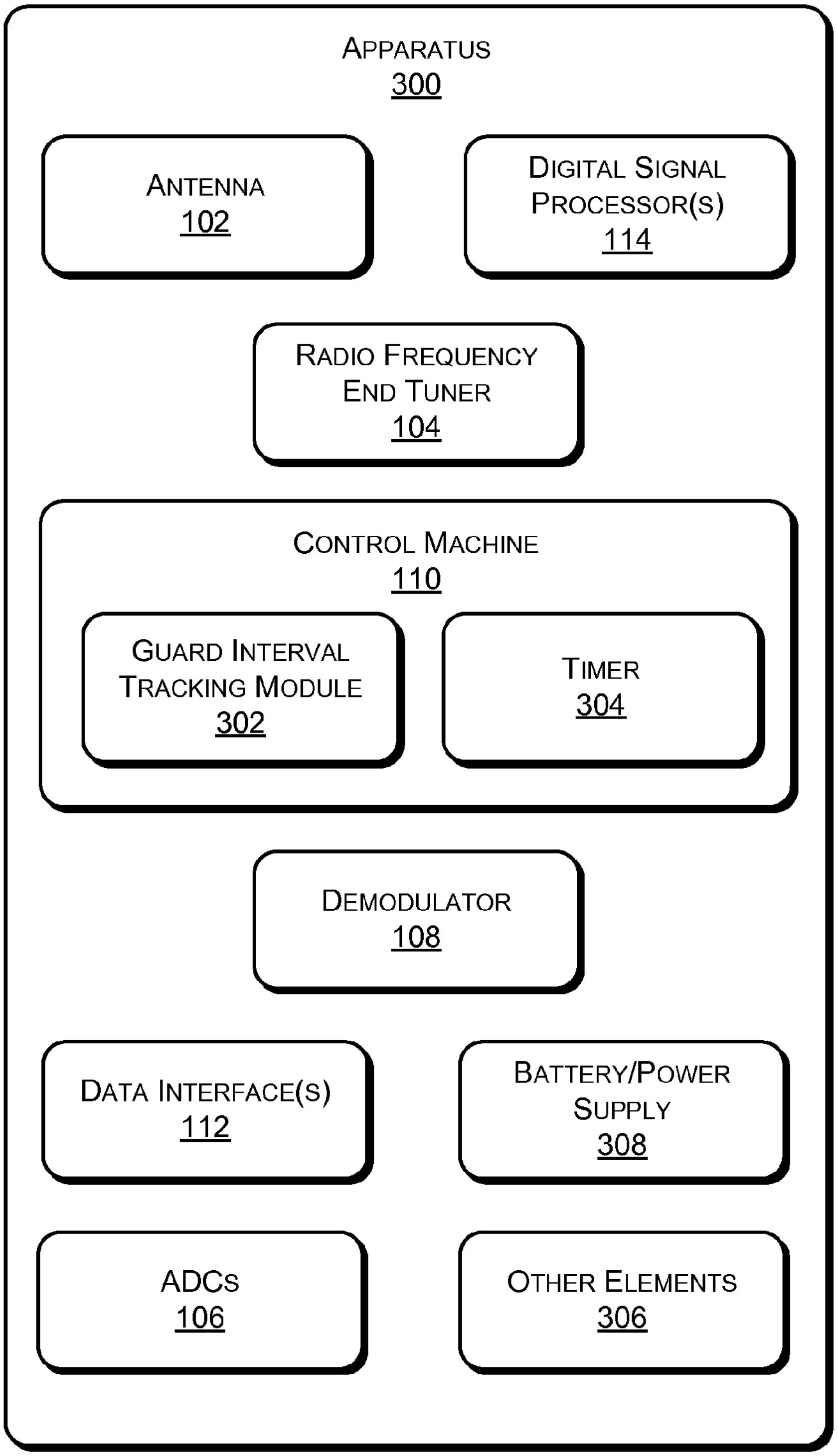
FIG. 3 is a block diagram illustrating an implementation of a device implementing controlled transmission of data in a data transmission system.

FIG. 3 illustrates an implementation of a device or an apparatus 300 implementing controlled transmission of data during guard intervals. The apparatus 300 may be an electronic device. Apparatus 300 includes one or more antennas 102 for transmitting and receiving RF signals (e.g., receiving OFDM signal). The antenna(s) 102 may be configured to receive different RF signals in different bands.

Radio frequency end tuner 104 receives the RF signals from the antenna 102. The radio frequency end tuner 104 converts the RF signal to a baseband signal. The radio frequency end tuner 104 sends the baseband signal to ADCs 106. The ADCs 106 convert the baseband signal to a digital baseband signal. In certain implementations, the baseband signal may be a digital signal obtained from a digital RF signal. In such implementations, the radio frequency end tuner 104 sends the baseband signal directly to the control machine 110.

Control machine 110 analyzes the digital baseband signal to identify its characteristics and sends the digital baseband signal to demodulator 108. As discussed above, the characteristics may include length of guard intervals and symbols. In an implementation, the demodulator 108 receives the digital signal directly from the ADC 106. In such an implementation, the control machine 108 examines the digital baseband signal in parallel with the operation of the demodulator 110.

The demodulator 108 demodulates or decodes relevant data from the digital baseband signal to generate the demodulated signal. The process of demodulation may include removal of guard intervals carrying unwanted information and collection of the symbols including the relevant data. The demodulator 112 sends the demodulated signal for further processing by the external system 114 for presentation to the user through the data interface 112. The external system 114 may be configured to perform control and command functions, including accessing and controlling the components of the device 300. As discussed above, the data interface 112 may include data busses, printed circuit boards, and integrated circuits (ICs).

Referring back to the control machine 110, the control machine 110 includes a guard interval tracking module 302 and a timer 304. The guard interval tracking module 302 initially identifies the characteristics of the digital baseband signal, (i.e., starting points and length of each guard intervals). In operation, the guard interval tracking module 302 generates a guard interval start signal that denotes the beginning of a guard interval of the RF signal received at the device 300 or incoming RF signal based on the characteristics of the digital baseband signal.

In an implementation, the guard interval tracking module 302 sends the guard interval start signal to the data interface 112 to initiate transmission of the demodulated signal. As discussed above, the data interface 112 may generate signals during transmission of the demodulated signal. The signals may include, for example, data, noises, sounds, and any other disturbances to symbols of in the RF signal.

For example, the demodulator 108 may transmit the demodulated data through various data busses. These data busses may generate unwanted noises or any disturbances while transferring the demodulated data. For example, such unwanted noises may interfere or couple with the incoming RF signals received at the apparatus 300 and thereby degenerate the sensitivity of the apparatus 300 to RF signals of low frequencies.

As the guard interval start signal instructs the data interface 112 to transmit the demodulated signal, the noises (i.e., signals generated by the data interface 112) fall within the guard interval of the incoming RF signals. In an implementation, the guard interval start signal simultaneously triggers the timer 304 to identify the permissible time duration for data transfer during the guard intervals. The permissible time duration for data transfer may be equal to the length of the guard interval. In another implementation, the guard interval tracking module 302 directly instructs the timer 304 to calculate the permissible time duration for data transfer. In a possible implementation, the timer 304 marks the permissible time for data transfer based on the characteristics of the digital baseband signal received from the guard interval tracking module 302.

The timer 304 is further configured to control the data interface 112 to transfer the demodulated signal during the marked permissible time for data transfer. In such a case, the timer 304 may instruct the data interface 112 to stop the transfer of the demodulated signal once a guard interval elapses. As a result, the signals generated by the data interface 112 falls within the guard interval of the incoming RF signal. A graphical representation of controlled data transfer during the guard interval is explained below in FIG. 4. Upon receiving instruction from the control machine 108, the data interface 112 may resume generation of the demodulated signal when subsequent guard intervals commence.

The data interface 112 transmits the demodulated signal to external system 114 for presentation to the user through output interfaces shown as a part of other elements 306. The output interfaces may include, for example, a user screen, speakers, and so on. The device 300 includes a battery/power supply 308 that provides power to the device 300 to operate.

Figure 4:
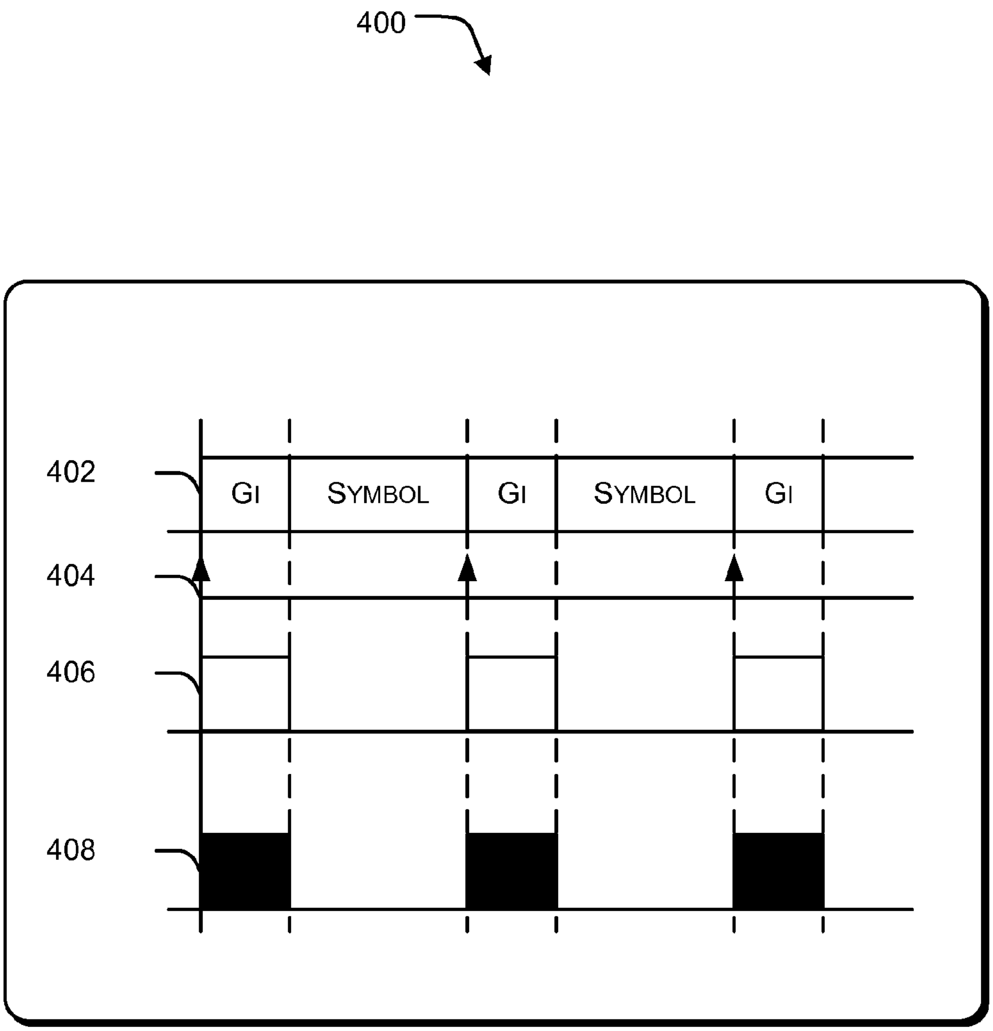
FIG. 4 is a graph illustrating radio frequency signals with controlled transmission of data in a data transmission system.

FIG. 4 illustrates radio frequency signals with controlled transmission of data in a data transmission system. The graph 400 shows the RF signal signals within the length of the guard intervals. The graph 400 shows a RF signal 402 including guard intervals and symbols. The timeline 404 indicates the points when the guard interval start signal may be received at the data interface 112. As discussed above, the guard interval start signal denotes the beginning of a guard interval of the RF signal 402. Therefore, according to the graph 400, separate guard interval start signals marking the starting points of the guard intervals may be generated by the control machine 108.

The timeline 406 depicts the time duration when data transfer may be enabled. As shown in timeline 406, the data interface 112 may transmit the data or demodulated signal throughout the length of the guard interval. Due to such controlled transmission of the data, the signals may be restricted to the guard interval. Further during data transfer, the data interface 112 may be informed of a permissible time duration for data transfer (i.e., length of the guard interval).

Timeline 408 depicts the controlled transfer of the signals by the data interface 112 during the length of the guard interval. This can be accomplished by instructing the data interface 112 to operate during the guard intervals as shown in the graph 400. Thus, the coupling of signals with the symbols (i.e., actual data) may be eliminated resulting in reduced probability of errors in decoded actual data obtained from the RF signal 402.

Exemplary Process

Figure 5:
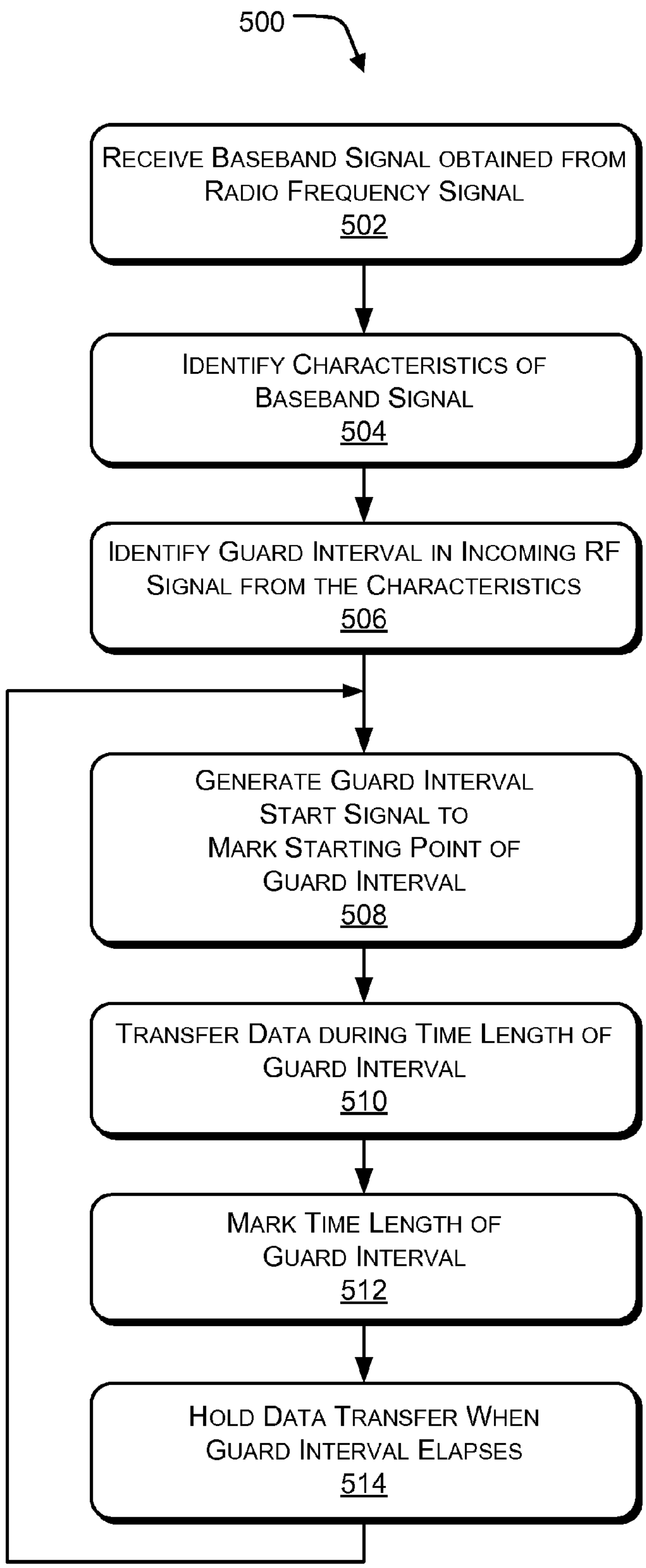
FIG. 5 is a flow diagram for a process for transmitting data in a controlled manner in a data transmission system.

FIG. 5 shows an exemplary process 500 for transmitting data during guard intervals in a controlled manner. Specific exemplary methods are described below; however, it should be understood that certain acts need not be performed in the order described, and may be modified, and/or may be omitted entirely, depending on the circumstances.

At block 502, baseband signals obtained from RF signals are received. The received RF signal may be a digital signal that includes relevant data to be transmitted in the form of symbols. As mentioned previously, the symbols may be separated by guard intervals. The received RF signal may be received by one or more antennae, such as antenna 102. The RF signal is then converted into a baseband signal by the radio frequency end tuner 104.

In an implementation, the baseband signal may be an analog baseband signal obtained from an analog RF signal. The analog baseband signal may be converted into a digital baseband signal using the ADC 106.

At block 504, characteristics associated with the baseband signal are identified. The characteristics may include length and starting points associated with the guard intervals and symbols. In an implementation, the control machine 110 determines the characteristics of the baseband signal. As discussed above, the length of the guard interval represents the permissible time duration for transfer of signals generated by the data interface 112. The identified characteristics may be stored at the control machine 110. Thereafter, the baseband signal may be demodulated to generate demodulated data. In other words, the demodulated signal that can be transmitted by the data interface 112 for processing by the external system 114.

The control machine 110 may also determine the starting points and lengths of the guard interval of the baseband signal. In such a case, the control machine 110 may identify the length of the symbols based on the pre-determined starting points and lengths of the guard intervals.

At block 506, the guard intervals in the incoming RF signal are identified based on the characteristics. In an implementation, the control machine 110 identifies the guard intervals of the incoming RF signal based on the characteristics of the baseband signal. Based on the information, the control machine 110 identifies the position of the symbols and guard intervals of the incoming RF signal.

At block 508, a guard interval start signal is generated to mark a starting point of a guard interval of an incoming RF signal. The guard interval start signal may be generated by the control machine 110 based on characteristics associated with the baseband signal. The control machine 110 may identify the guard interval of the incoming RF signal, and sends the guard interval start signal indicating the starting point of the guard interval to the data interface 112.

At block 510, transfer of data is enabled during the time length of the guard interval. The guard interval start signal instructs the data interface 112 to transmit the data, such as demodulated signal, within the time length of the guard interval. During such transmission, the control machine 110 may generate signals that can be included within the guard interval.

At block 512, a time length of the guard interval is marked. The guard interval start signal may trigger a timer 304 to mark the time length of the guard interval. In an implementation, the timer 304 may be configured to track the guard interval and mark the time length. During the time length of the guard interval, the data interface 112 continues to transfer the data. The process of marking the time length enables the timer 304 to determine a limit within which the transfer of data by the data interface 112 may be restricted. The timer 306 may also mark the time length based on the characteristics of the digital baseband signal gathered by the control machine 110.

At block 514, transfer of data may be held once the guard interval elapses. The timer 304 may be configured to instruct the data interface 112 to halt the transfer of data once the guard interval elapses, based on the marked time length of the guard interval. As a result, the signals generated by the data interface 112 fall within the guard interval. Thus an interference of the signals and actual data or symbols of the incoming RF signals may be avoided.

In an implementation, the timer 304 may provide the time lengths of the guard intervals of incoming RF signal to the guard interval tracking module 302. Based on the time lengths, guard interval tracking module 302 may instruct the data interface 112 to hold the transfer of data once the guard interval elapses.

The process 500 may proceed as a cyclic process by generating guard interval start signals marking the starting points of the subsequent guard intervals and restricting the transfer of data within the time lengths of these guard intervals.

CONCLUSION

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims. For example, the systems described could be configured as wireless communication devices, computing devices, and other electronic devices.

What is claimed is:

1. A method, comprising:

receiving a baseband signal that includes symbols and guard intervals;

identifying characteristics associated with the baseband signal, symbols, and guard intervals, wherein start points and end points for symbols are identified; and enabling the data transfer during a time interval of a guard interval.

2. The method of claim 1, wherein the receiving includes converting the baseband signal from a received analog RF signal.

3. The method of claim 1, wherein the identifying includes identifying lengths of the symbols and the guard intervals.

4. The method of claim 1, wherein the enabling includes instructing data transfer during a time length of the guard interval.

5. The method of claim 1, further comprising marking a time length of the guard intervals.

6. A data receiver comprising:

a radio frequency (RF) device to receive analog RF signals;

one or more Analog to Digital Converters (ADCs) to convert the analog RF signals to digital baseband signals;

a control machine to identify characteristics of symbols and cyclic expansions in the digital baseband signals; and a data interface to transmit the symbols in the digital baseband signals based on the characteristics identified by the control machine.

7. The data receiver of claim 6, wherein the RF device receives the analog RF signals in the form of OFDM signals, and the cyclic expansions are guard intervals in the OFDM signals.

8. The data receiver of claim 6, wherein the control machine is to identify the following characteristics:

starting points and time length of the symbols and cyclic expansions.

9. The data receiver of claim 6, wherein the control machine includes a guard tracking module to identify characteristics of the baseband signals, and a timer to control the data interface in transmission of the demodulated signals.

10. The data receiver of claim 9, wherein the guard tracking module is to generate start signals of the symbols and the cyclic expansions, wherein the start signals are to be passed to the data interface.

11. The data receiver of claim 9, wherein the timer is to control the data interface to transmit the symbols during a marked permissible time.

12. The data receiver of claim 6, further comprising a digital signal processor to receive and process the symbols.

13. An apparatus comprising:

a radio frequency (RF) device to receive RF signals and send baseband signals;

a control machine to receive demodulated signals;

a data interface to receive the demodulated signals and control information from the control machine, and to initiate transmission of the demodulated signals; and a guard tracking module to identify characteristics of the baseband signals, and a timer to control the data interface in transmission of the demodulated signals.

14. The apparatus of claim 13, further comprising a demodulator to identify lengths of symbols and guard intervals in the baseband signals.

15. The apparatus of claim 13, further comprising a demodulator to remove guard intervals and collect symbols in the baseband signals.

16. The apparatus of claim 13, wherein the control machine provides start and end marks of guard intervals to the data interface to transmit the demodulated signals.

17. The apparatus of claim 13, wherein the data interface receives instruction from the control machine to transmit the demodulated signals.

18. The apparatus of claim 13, further comprising an Analog to Digital Converter that convert the baseband signals, if the baseband signals are analog, into digital baseband signals, and passes the digital baseband signals.

* * * * *